United States Patent
Chang et al.

(10) Patent No.: US 9,997,632 B2
(45) Date of Patent: Jun. 12, 2018

(54) FIN-TYPE FIELD EFFECT TRANSISTOR DEVICE AND MANUFACTURING METHOD THEREOF

(71) Applicant: Taiwan Semiconductor Manufacturing Co., Ltd., Hsichu (TW)

(72) Inventors: Che-Cheng Chang, New Taipei (TW); Chih-Han Lin, Hsinchu (TW); Horng-Huei Tseng, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days. days.

(21) Appl. No.: 14/968,910

(22) Filed: Dec. 15, 2015

(65) Prior Publication Data
US 2017/0170322 A1    Jun. 15, 2017

(51) Int. Cl.
| | |
|---|---|
| H01L 29/78 | (2006.01) |
| H01L 29/423 | (2006.01) |
| H01L 29/49 | (2006.01) |
| H01L 29/51 | (2006.01) |
| H01L 29/66 | (2006.01) |
| H01L 21/02 | (2006.01) |
| H01L 21/3065 | (2006.01) |
| H01L 21/768 | (2006.01) |
| H01L 21/311 | (2006.01) |

(52) U.S. Cl.
CPC ...... *H01L 29/7856* (2013.01); *H01L 21/0214* (2013.01); *H01L 21/0217* (2013.01); *H01L 21/0228* (2013.01); *H01L 21/02274* (2013.01); *H01L 21/02631* (2013.01); *H01L 21/3065* (2013.01); *H01L 21/31111* (2013.01); *H01L 21/76841* (2013.01); *H01L 21/76879* (2013.01); *H01L 29/42364* (2013.01); *H01L 29/495* (2013.01); *H01L 29/4916* (2013.01); *H01L 29/518* (2013.01); *H01L 29/66795* (2013.01); *H01L 29/7848* (2013.01)

(58) Field of Classification Search
None
See application file for complete search history.

(56) References Cited

U.S. PATENT DOCUMENTS

| | | | |
|---|---|---|---|
| 6,372,636 B1 * | 4/2002 | Chooi | H01L 21/76807 257/E21.579 |
| 8,836,129 B1 * | 9/2014 | Hung | H01L 23/485 257/758 |
| 9,397,003 B1 * | 7/2016 | Niimi | H01L 21/823418 |
| 9,530,887 B1 * | 12/2016 | Chang | H01L 29/7848 |

(Continued)

*Primary Examiner* — Abul Kalam
(74) *Attorney, Agent, or Firm* — JCIPRNET (57) ABSTRACT

A fin-type field effect transistor device including a substrate, at least one gate stack structure, spacers and source and drain regions is described. The gate stack structure is disposed on the substrate and the spacers are disposed on sidewalls of the gate stack structure. The source and drain regions are disposed in the substrate and located at opposite sides of the gate stack structures. A dielectric layer having contact openings is disposed over the substrate and covers the gate stack structures. Metal connectors are disposed within the contact openings and connected to the source and drain regions, and adhesion layers are sandwiched between the contact openings and the metal connectors located within the contact openings.

20 Claims, 6 Drawing Sheets

(56) References Cited

U.S. PATENT DOCUMENTS

| | | | |
|---|---|---|---|
| 2002/0025669 A1* | 2/2002 | Hwang | H01L 21/76888 438/637 |
| 2011/0062502 A1* | 3/2011 | Yin | H01L 21/76816 257/288 |
| 2012/0205729 A1* | 8/2012 | Chau | H01L 29/66628 257/288 |
| 2014/0001520 A1* | 1/2014 | Glass | H01L 29/66439 257/288 |
| 2014/0103456 A1* | 4/2014 | Chau | H01L 29/66628 257/410 |
| 2016/0181383 A1* | 6/2016 | Huang | H01L 29/41758 257/757 |

* cited by examiner

FIN-TYPE FIELD EFFECT TRANSISTOR DEVICE AND MANUFACTURING METHOD THEREOF

BACKGROUND

Since the gate width and the channel length of the semiconductor devices keeps shrinking, non-planar or three-dimensional field effect transistor structures, such as fin-type field effect transistors (FinFETs) having elevated vertical fins, have been developed to boost the operation speed of the transistors.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The embodiments of the present disclosure describe the exemplary manufacturing processes of FinFET devices and the FinFET devices fabricated there-from. The FinFET device may be formed on a monocrystalline semiconductor substrate, such as a bulk silicon substrate in certain embodiments of the present disclosure. In some embodiments, the FinFET device may be formed on a silicon-on-insulator (SOI) substrate or a GOI (germanium-on-insulator) substrate as alternatives. Also, in accordance with the embodiments, the silicon substrate may include other conductive layers, doped regions or other semiconductor elements, such as transistors, diodes or the like. The embodiments are intended to provide further explanations but are not used to limit the scope of the present disclosure.

Figure 1:
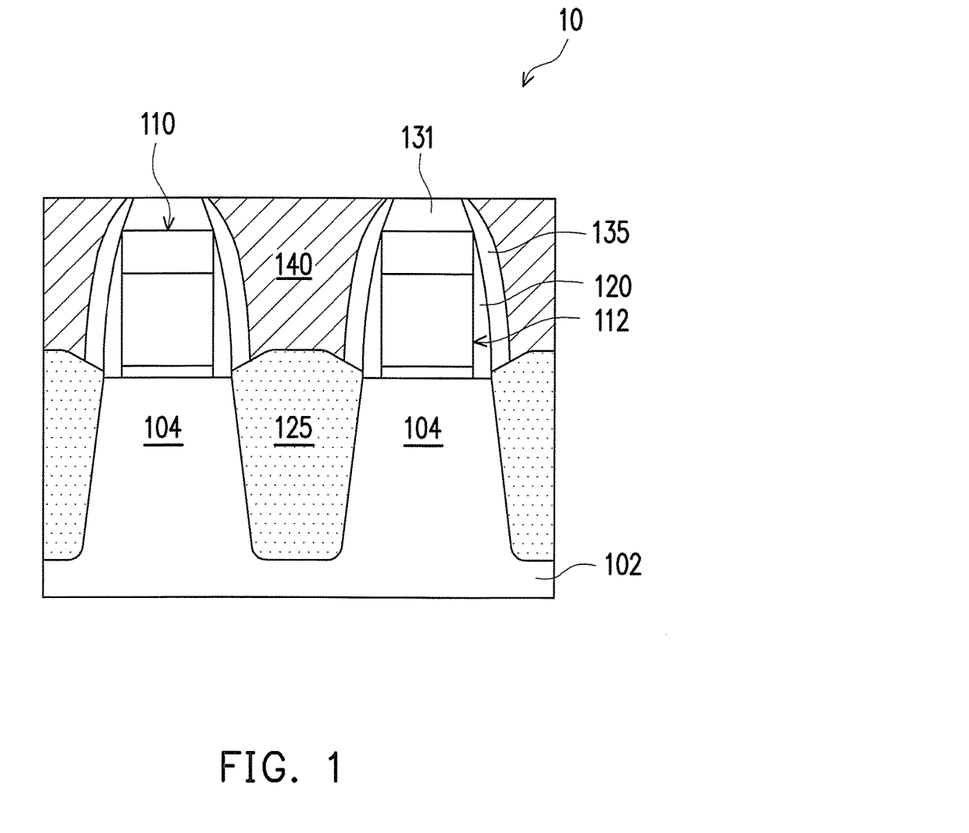
FIG. 1 illustrates a cross-sectional view of an exemplary FinFET device in accordance with some embodiments of the present disclosure.

FIG. 1 illustrates a cross-sectional view of an exemplary FinFET device in accordance with some embodiments of the present disclosure. In FIG. 1, the FinFET device 10 comprises at least one gate stack structure 110 formed on a substrate 102, spacers 120 formed on opposite sidewalls 112 of the gate stack structure 110, and source and drain regions 125 located within the substrate 102 and at two opposite sides of the gate stack structure 110. The FinFET device 10 also comprises a dielectric layer 131 located above and covering the gate stack structure 110 and the spacers 120, at least one metal connector 140 connected to the source and drain regions 125 and a sheath structure 135 located between the metal connector 140 and the dielectric layer 130 and the spacers 120. In some embodiments, the gate stack structure 110 includes a polysilicon gate structure or a replacement metal gate structure. In some embodiments, the source and drain regions 125 located beside the spacers 120 and the gate stack structure 110 are strained source and drain regions. The FinFET device 10 is intended to be located between isolation structures (not shown) of the substrate 102. In some embodiments, the FinFET device 10 is a p-type FinFET device. In some embodiments, the FinFET device 10 is an n-type FinFET device.

Figure 2A:
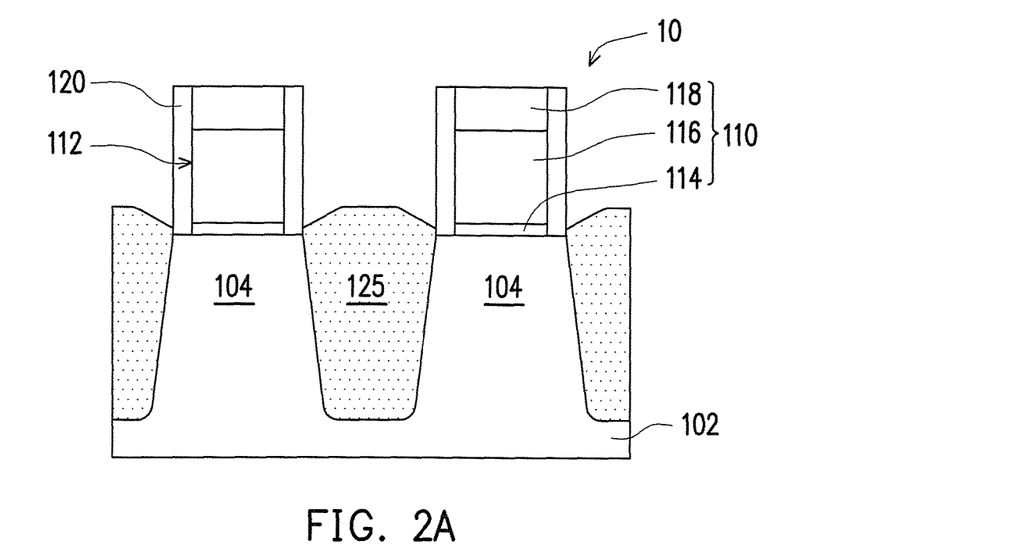
FIGS. 2A-2G are the cross-sectional and top views showing the FinFET device at various stages of the manufacturing method for forming a FinFET device according to some embodiments of the present disclosure.

FIGS. 2A-2G illustrate the cross-sectional views and top view of the FinFET device at various stages of the manufacturing methods for forming a FinFET device according to some embodiments of the present disclosure. In FIG. 2A, a substrate 102 formed with at least one gate stack structure 110 and source and drain regions 125 is provided. The substrate 102 is a monocrystalline semiconductor substrate or a SOI substrate, for example. In some embodiments, the substrate 102 is a silicon substrate. In some embodiments, more than one gate stack structures 110 are formed on the substrate 102 and the gate stack structures 110 are strip-shaped structures arranged in parallel. In FIG. 2A, two gate stack structures 110 are shown, and the number of the gate stack structures 110 are for illustrative purposes but not intended to limit the structure of the present disclosure. In some embodiments, the gate stack structure 110 includes a polysilicon gate structure or a replacement metal gate structure. In some embodiments, the gate stack structure 110 comprises a gate dielectric strip 114, a gate electrode strip 116 located on the gate dielectric strip 114, and a hard mask strip 118 located on the gate electrode strip 116. Also, the spacers 120 located on opposite sidewalls 112 of the gate stack structure 110. In some embodiments, the gate stack structures 110 are formed by forming a gate dielectric layer (not shown), depositing a gate electrode material layer (not shown), a hard mask layer (not shown) over the gate electrode material layer and then patterning the hard mask layer, the gate electrode material layer and the gate dielectric layer to form the gate dielectric strips 114, the gate electrode strips 116 and the hard mask strips 118. The material of the gate electrode strip 116 comprises either doped or undoped polysilicon or a metal-containing conductive material. The metal-containing conductive material comprises aluminum (Al), copper (Cu), tungsten (W), cobalt (Co), titanium (Ti), tantalum (Ta), ruthenium (Ru), TiN, TiAl, TiAlN, TaN, TaC, NiSi, CoSi or a combination thereof. In some embodiments, the material of the gate dielectric strip 114 comprises silicon oxide, silicon oxynitride, silicon nitride or the combination thereof. In some embodiments, the material of the gate dielectric strip 114 comprises a high-k dielectric material, and the high-k dielectric material has a k value greater than about 7.0 and includes a metal oxide or a silicate of hafnium (Hf), Al, zirconium (Zr), lanthanum (La), magnesium (Mg), barium (Ba), Ti, lead (Pb) and combinations thereof. Depending on whether the FinFET device 10 is a p-type FinFET device or an n-type FinFET device, the materials of the gate dielectric strips 114 and/or the gate electrode strips 116 are chosen based on the product requirements. In one embodiment, the hard mask strips 118 are formed of silicon nitride, silicon oxide or the combination thereof, for example. In some embodiments, the spacers 120 are single-layered or multilayered structures. In certain embodiments, the material of the spacers 120 includes silicon nitride, silicon oxynitride, a combination thereof or other suitable dielectric materials. In some embodiments, the spacers 120 are formed by depositing a blanket layer of a dielectric material (not shown) and performing an anisotropic etching process to form the spacers 120 on opposite sidewalls 112 of the gate stack structure 110.

In FIG. 2A, the source and drain regions 125 are formed within the substrate 102 beside the gate stack structures 110 and the spacers 120. In some embodiments, the source and drain regions 125 are strained source and drain regions or raised epitaxial source and drain regions. In some embodiments, the source and drain regions 125 are formed by recessing a portion of the substrate 102 at the locations intended for source and drain regions using one or more anisotropic etching and isotropic etching processes, and filling up the recesses portion of the substrate 102 with a strained material (not shown). As the channel region is located between the source and drain regions 125 disposed at opposite sides of gate stack structure 110, the channel region 104 is strained or stressed to increase carrier mobility of the device and enhance the device performance. In some embodiments, some of the source and drain regions 125 are substantially coplanar with or slightly protruded out of the substrate surface. In certain embodiments, the strained material is silicon germanium (SiGe) if the FinFET device 10 is a p-type FinFET device or the strained material is silicon carbide (SiC) if the FinFET device 10 is an n-type FinFET device. In some embodiments, the source and drain regions 125 are formed using cyclic deposition-etch (CDE) epitaxy process or selective epitaxial growth (SEG) process to form the strained material of high crystal quality. In one embodiment, the source and drain regions are strained source and drain regions and the material of the source and drain regions 125 comprises boron-doped SiGe formed by selectively growing epitaxy with in-situ doping. In certain embodiments, the source and drain regions 125 are optionally formed with silicide layers (not shown) by silicidation.

Figure 2B:
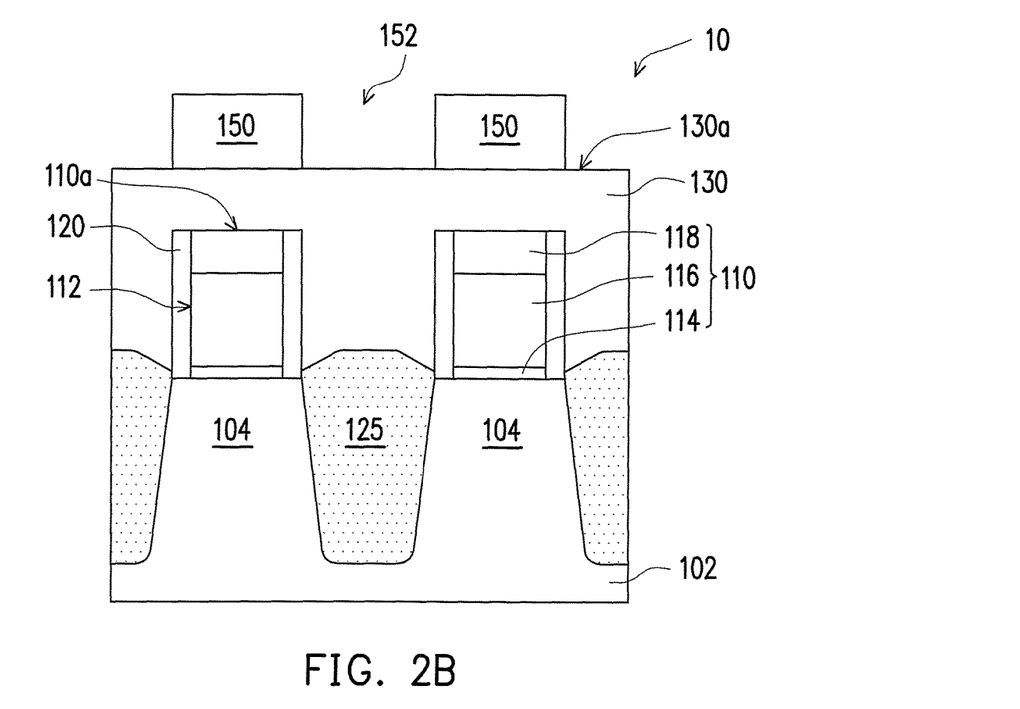

In FIG. 2B, a dielectric layer 130 is formed over the substrate 102 covering the gate stack structures 110, the spacers 120 and the source and drain regions 125. In some embodiments, the dielectric layer 130 is an inter-layer dielectric (ILD) layer. In one embodiment, the dielectric layer 130 is formed to fill up gaps between the gate stack structures 110 until the top surface 130a of the dielectric layer 130 is higher than the top surfaces 110a of the gate stack structures 110. In some embodiments, the dielectric layer 130 includes at least one dielectric material selected from silicon oxide, silicon nitride, SiC, silicon carbonitride (SiCN) or a low-k dielectric material. The low-k dielectric material has a k value lower than about 4.0 and includes carbon-containing oxides or silicate glass formed by plasma-enhanced chemical vapor deposition (PECVD) or spin-on method(s). After forming the dielectric layer 130, a mask pattern 150 including a plurality of holes 152 is formed on the dielectric layer 130. The mask pattern 150 is used as an etching mask for etching the underlying dielectric layer 130 in the subsequent process. In some embodiments, the mask pattern 150 includes a photoresist material. The locations of the holes 152 correspond to the intended locations of the subsequently formed contact holes.

Figure 2C:
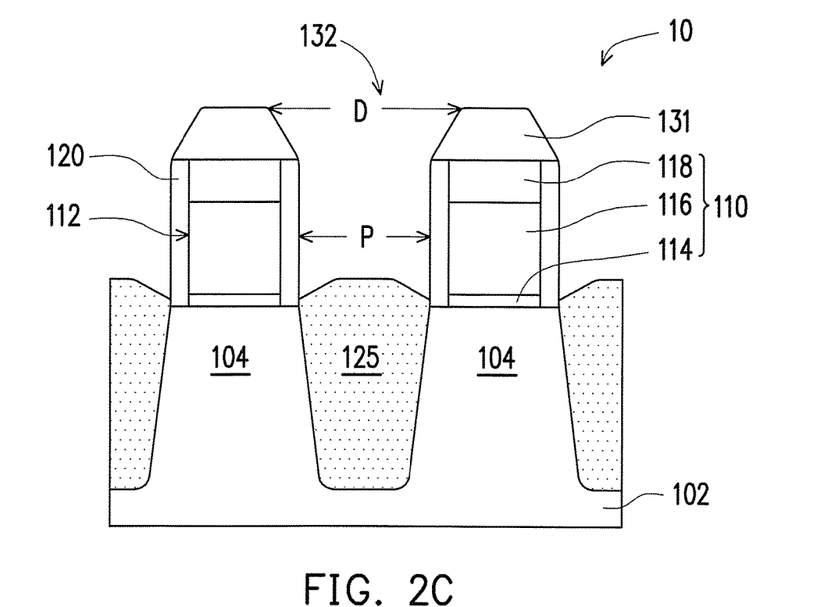

Referring to FIG. 2C, the dielectric layer 130 (FIG. 2B) is partially removed by etching through the dielectric layer 130 to form a plurality of contact openings 132 over the source and drain regions 125. In some embodiments, the dielectric layer 130 is etched until the source and drain regions 125 are exposed and the patterned dielectric layer 131 still covers the gate stack structures 110. In some embodiments, the mask pattern 150 (FIG. 2B) is removed during the etching of the dielectric layer 130 or is removed after the etching of the dielectric layer 130. In certain embodiments, the formation of the contact openings 132 (the etching of the dielectric layer 130) comprises one or more anisotropic etching processes, reactive ion etching (RIE) processes, or a combination thereof. Depending on the materials chosen for the dielectric layer 130, the hard mask strip(s) 118 and/or the spacers 120, the etching rate and etching selectivity for the etching generally are adjusted so that the dielectric layer 130 is etched downward to expose the source and drain regions 125 as well as the spacers 120, but the removal of the spacers 120 and the hard mask strip(s) 118 is minimized. In some embodiments, due to the high aspect ratio of the contact openings 132, the process window for the etching is rather small and over-etching occurs to the dielectric layer 130 and/or the spacers 120 and causes the contact openings 132 to become wider at the upper portions. In one embodiment, a top dimension D of the contact openings 132 is slightly larger than a spacing P between the gate stack structures. In some embodiments, the contact openings 132 are located between the two most adjacent gate stack structures 110 and portions of the source and drain regions 125 and the spacers 120 are exposed by the contact openings 132. In certain embodiments, the shapes of the contact openings 132 (from the top view) are determined according to the design of the mask pattern and may be round, elliptical, quadrangular or in any polygonal shape depending on the product requirements. The contact opening described herein may be a circular or a polygonal hole or a trench extending for a length over the substrate 102.

Figure 2D:
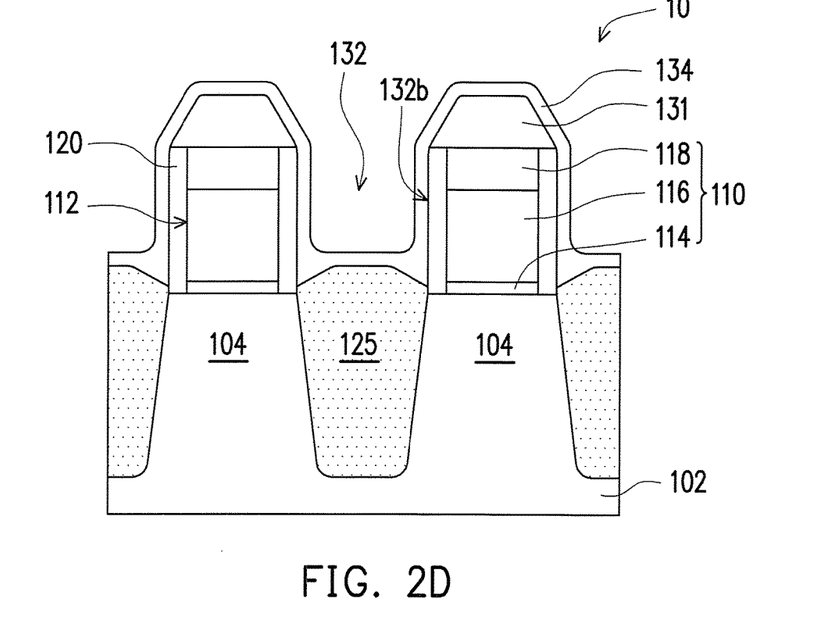

In some embodiments, as shown in FIG. 2D, following the etching of the dielectric layer 130, a blanket adhesion layer 134 substantially conformal to the topology of the above-described structure (the exposed source and drain regions 125, the spacers 120 and the patterned dielectric layer 131 located above the gate stack structure 110) is formed over the substrate 102. In certain embodiments, the adhesion layer 134 is substantially conformal to the profiles of the contact openings 132 and evenly covers the sidewalls 132b of the contact openings 132 and the source and drain regions 125. In some embodiments, the material of the adhesion layer 134 may be the same as or different from that of the spacers 120 and the material of the adhesion layer 134 includes silicon nitride, silicon oxynitride, SiCN or a combination thereof. In one embodiment, the formation of the adhesion layer 134 includes an atomic layer deposition (ALD) process or a plasma-enhanced ALD (PEALD) process and the adhesion layer 134 has a thickness in the range of 5 Å to 100 Å.

Figure 2E:
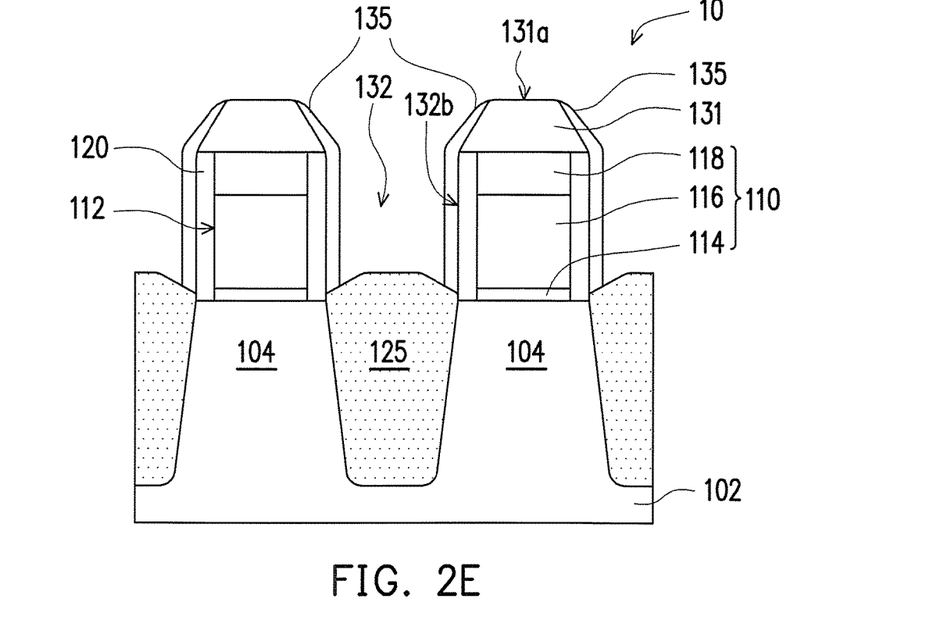

FIG. 2E is an exemplary cross-sectional view showing a portion of the FinFET device 10, while FIG. 2E' is an exemplary top view showing a portion of the FinFET device 10 according to certain embodiments of the present disclosure In FIG. 2E, the conformal adhesion layer 134 (FIG. 2D) is etched to form sheath structures 135 disposed on the sidewalls 132b of the contact openings 132 by removing the adhesion layer 134 located on the source and drain regions 125 and removing the adhesion layer 134 located on the patterned dielectric layer 131. In certain embodiments, the sheath structures 135 (the remained adhesion layer) disposed on the sidewalls 132b of the contact openings 132 cover the spacers 120 and a portion of the patterned dielectric layer 131 but expose the source and drain regions 125. As shown in FIG. 2E', in one embodiment, using a circular contact opening as an example, the sheath structure 135 looks like a hollow circle but is shaped like a closed wall structure arranged along the opening 132 to expose the source and drain regions 125. In some embodiments, the formation of the sheath structures 135 (the etching of the conformal adhesion layer 134) comprises one or more anisotropic etching processes. In certain embodiments, the flow rate of the etching gases, the pressure and/or the etching temperature of the one or more anisotropic etching processes can be adjustable to control the etching of the adhesion layer 134 to selectively remove the adhesion layer 134 located on the source and drain regions 125 and located on the patterned dielectric layer 131 with least damages so that the top surface 131a of the patterned dielectric layer 131 and the source and drain regions 125 are exposed. On account of the better protection provided by the adhesion layer 134 covering the spacers 120 and the patterned dielectric layer 131, the etching process window becomes larger. In one embodiment, the material of the adhesion layer 134 is selected based on the performed anisotropic etching process so that the adhesion layer 134 located on the source and drain regions 125 is selectively etched up to expose the source and drain regions 125 while the adhesion layer 134 on the spacers 120 and the patterned dielectric layer 131 is remained for better insulation. That is, the sheath structures 135 (the remained adhesion layer) located within the contact openings 132 reinforce the isolation and insulation between the gate stack structures 110 and the subsequently formed metal connector or contacts. As mentioned previously, in some embodiments, the dielectric layer 130 and/or the spacers 120 may be over-etched or even pulled down during the formation of the contact openings 132 and the later formed adhesion layer 134 further covers the spacers 120 and the patterned dielectric layer 131 to fortify the isolation of the gate stack structure. Hence, the in-line control for the formation of the contact openings 132 becomes better and the process window for the formation of the metal connector(s) or contact(s) is enlarged.

Figure 2F:
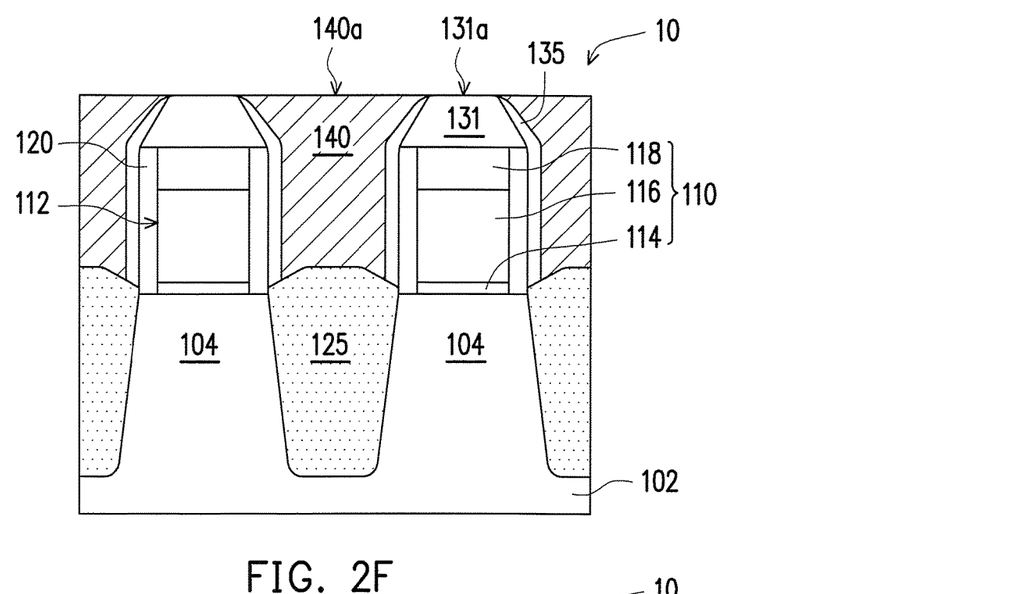

In some embodiments, after the formation of the sheath structures 135, metal connectors 140 are formed within the contact openings 132 as shown in FIG. 2F. In some embodiments, after a metal material (not shown) is formed filling up the contact openings 132 and covering the patterned dielectric layer 131, a planarization process, such as a chemical mechanical polishing (CMP) process, is performed to remove portions of the metal material above the patterned dielectric layer 131, and the metal material remain in the contact openings 132 over the source and drain regions 125 serve as the metal connectors 140 to the source and drain regions 125. After the planarization process, the top surfaces 140a of the metal connectors 140 are substantially coplanar with the top surface 131a of the patterned dielectric layer 131. In some embodiments, the material of the metal connectors 140 includes tungsten, copper, the alloys thereof or any metal material with suitable resistance and gap-fill capability. In one embodiment, the metal connectors include tungsten formed by sputtering, chemical vapor deposition (CVD) or electrochemical plating (ECP). In FIG. 2F, the sheath structure 135 is located between the metal connector 140 and the spacers 120 and the patterned dielectric layer 131, and the metal connector 140 is isolated from the gate stack structure 110 by the sheath structure 135 as well as the spacers 120 and the patterned dielectric layer 131. The metal connectors 140 are electrically connected to the source and drain regions 125 and electrically isolated from the gate stack structures 110 through at least the sheath structures 135 and the spacers 120. In certain embodiments, as better isolation is provided from the formation of the adhesion layer 134 and the formation of the sheath structures 135, the reliability and the yield of the FinFET device(s) are improved and the wafer testing results, including the circuit probe testing results are boosted. In addition, smaller critical dimensions are permissible for the metal connectors due to the formation of the adhesion layer.

Figure 2G:
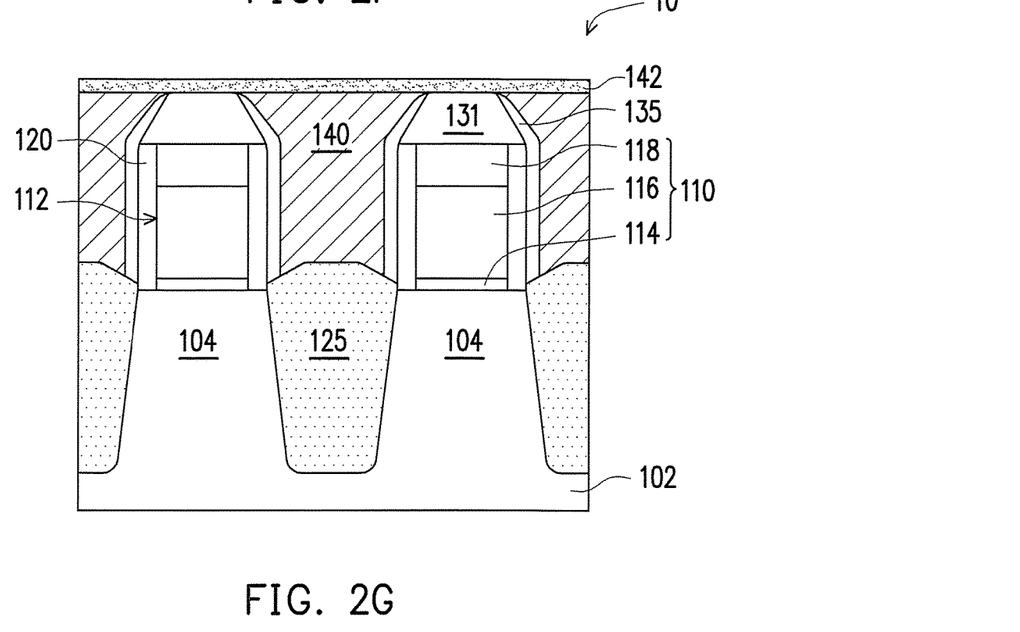

In FIG. 2G, a cap layer 142 is optionally formed over the metal connectors 140 and the patterned dielectric layer 131. In some embodiments, the cap layer 142 functions as an etching stop layer and the material of the cap layer 142 includes nitride.

In the above embodiments, the etching profile of the contact openings 132 is controlled not to lose much of the spacers 120 and/or the dielectric layer 130 and the adhesion layer further isolates the gate stack structure 110 from the metal connectors. For the devices with small dimensions, it is possible to form metal connectors of smaller feature sizes with better isolation so that the reliability of the device is improved and the performance of the device is enhanced. Also, the etching process window in accordance with the above embodiments of the present disclosure becomes larger and the metal connectors are accurately connected to the source and drain regions.

Figure 3:
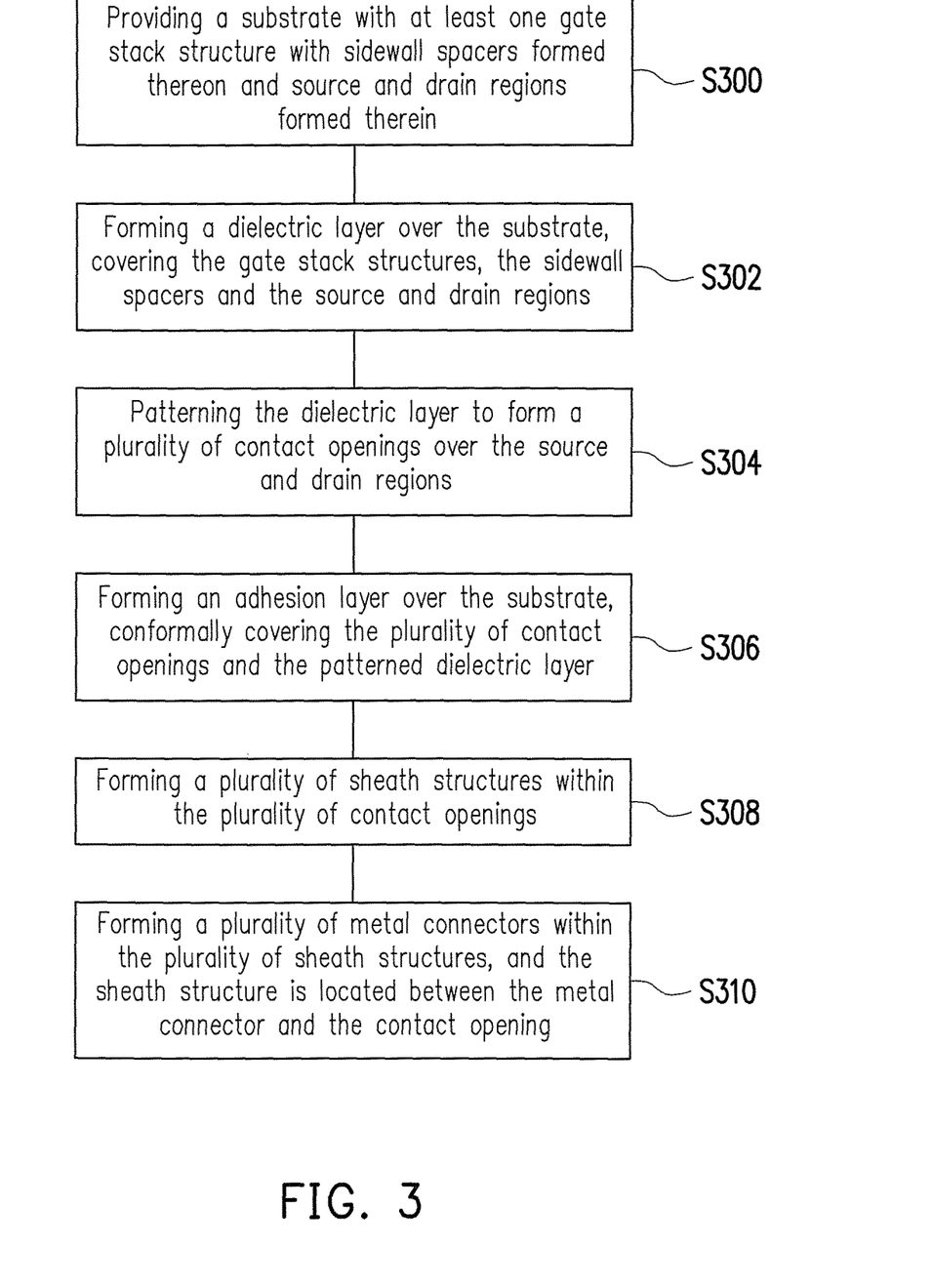
FIG. 3 is an exemplary flow chart showing the process steps of the manufacturing method for forming a FinFET device in accordance with some embodiments of the present disclosure.

FIG. 3 is an exemplary flow chart showing some of the process steps of the manufacturing method for forming a FinFET device in accordance with some embodiments of the present disclosure.

Although the steps of the method are illustrated and described as a series of acts or events, it will be appreciated that the illustrated ordering of such acts or events are not to be interpreted in a limiting sense. In addition, not all illustrated process or steps are required to implement one or more embodiments of the present disclosure.

In Step 300, a substrate is provided with at least one gate stack structure with sidewall spacers formed thereon and source and drain regions formed therein. The substrate is a silicon substrate or a silicon-on-insulator (SOI) substrate. In Step 302, a dielectric layer is formed over the substrate, covering the gate stack structures, the sidewall spacers and the source and drain regions. In Step 304, the dielectric layer is patterned to form a plurality of contact openings over the source and drain regions. In Step 306, an adhesion layer is formed over the substrate, conformally covering the plurality of contact openings and the patterned dielectric layer. In Step 308, a plurality of sheath structures is formed within the plurality of contact openings. In some embodiments, the sheath structures are formed by etching the adhesion layer until the source and drain regions are exposed and the etching of the adhesion layer comprises at least one anisotropic etching process, one RIE process or a combination thereof. In some embodiments, the sheath structures are in contact with the sidewalls of the contact openings but exposing the source and drain regions. In Step 310, a plurality of metal connectors is formed within the plurality of sheath structures, and the sheath structure is located between the metal connector and the contact opening.

In the above embodiments, the etching process window becomes larger and better isolation for the gate stack structure(s) is provided through the formation of the adhesion layer process. For the device having the gate stack structures arranged with tight pitch or spacing, the sheath structure(s) formed within the contact openings supports the formation of the metal connectors of smaller dimensions with good reliability. Since the metal connector(s) is well connected to the source and drain regions, the reliability of the device is enhanced and the electrical performance of the device is boosted.

In some embodiments of the present disclosure, a fin-type field effect transistor (FinFET) device is described. The FinFET device comprises a substrate having at least one gate stack structure, spacers and source and drain regions. The at least one gate stack structure is disposed on the substrate, and the spacers are disposed on sidewalls of the at least one gate stack structure. The source and drain regions are disposed in the substrate and located at opposite sides of the at least one gate stack structure. A dielectric layer is disposed over the substrate and on the at least one gate stack structure, and the dielectric layer includes at least one contact opening exposing the source and drain regions. The FinFET device comprises at least one sheath structure disposed within the at least one contact opening and at least one metal connector disposed within the at least one sheath structure and within the at least one contact opening. The at least one metal connector is connected to the source and drain regions.

In some embodiments of the present disclosure, a fin-type field effect transistor (FinFET) device is described. The FinFET device comprises a substrate having gate stack structures, spacers and source and drain regions. The gate stack structures are disposed on the substrate, and the spacers are disposed on opposite sidewalls of the gate stack structures. The source and drain regions are disposed in the substrate and located at opposite sides of the gate stack structures. A dielectric layer is disposed over the substrate and covers the gate stack structures, and the dielectric layer includes contact openings penetrating the dielectric layer to expose the source and drain regions. The FinFET device comprises metal connectors disposed within the contact openings and connected to the source and drain regions, and adhesion layers sandwiched between the contact openings and the metal connectors located within the contact openings.

In some embodiments of the present disclosure, a method for forming a fin-type field effect transistor is described. A substrate having gate stack structures with sidewall spacers formed on the gate stack structures and source and drain regions formed in the substrate is provided. A dielectric layer is formed over the substrate covering the gate stack structures, the sidewall spacers and the source and drain regions. The dielectric layer is patterned to form a plurality of contact openings over the source and drain regions. A plurality of sheath structures is formed within the plurality of contact openings, exposing the source and drain regions. A plurality of metal connectors is formed within the plurality of sheath structures. The plurality of sheath structures is located between the plurality of metal connectors and the plurality of contact openings.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A fin-type field effect transistor device, comprising:
   a substrate;
   at least one gate stack structure disposed on the substrate;
   spacers, disposed on sidewalls of the at least one gate stack structure;
   source and drain regions, disposed in the substrate and located at opposite sides of the at least one gate stack structure;
   a dielectric layer, disposed over the substrate and on the at least one gate stack structure, wherein the dielectric layer includes at least one contact opening exposing at least one of the source and drain regions;
   at least one sheath structure, disposed directly on at least one of the source and drain regions and disposed within the at least one contact opening, wherein the at least one sheath structure is made of a dielectric material; and
   at least one metal connector, disposed within the at least one sheath structure and within the at least one contact opening, wherein the at least one sheath structure encloses and wraps around all sidewalls of the at least one metal connector without being in contact with a bottom surface of the at least one metal connector, and the at least one metal connector is in direct contact with and is connected to at least one of the source and drain regions.

2. The device of claim 1, wherein the at least one metal connector is electrically connected to the source and drain regions and electrically isolated from the at least one gate stack structure through the at least one sheath structure and the spacers.

3. The device of claim 1, wherein the at least one sheath structure is in contact with the spacers exposed by the at least one contact opening and is located between the at least one metal connector and the at least one contact opening.

4. The device of claim 1, wherein a material of the at least one sheath structure comprises silicon nitride, silicon oxynitride, silicon carbonitride (SiCN) or a combination thereof.

5. The device of claim 1, wherein a material of the at least one metal connector comprises tungsten, copper or alloys thereof.

6. The device of claim 1, wherein the source and drain regions are strained source and drain regions and a material of the source and drain regions comprises silicon germanium or silicon carbide.

7. The device of claim 1, wherein the at least one gate stack structure includes a polysilicon gate structure or a replacement metal gate structure.

8. A fin-type field effect transistor device, comprising:
a substrate;
gate stack structures disposed on the substrate;
spacers, disposed on opposite sidewalls of each of the gate stack structures;
source and drain regions, disposed in the substrate and located at opposite sides of each of the gate stack structures;
a dielectric layer, disposed over the substrate and covering the gate stack structures, wherein the dielectric layer includes contact openings penetrating the dielectric layer to expose the source and drain regions; and
metal connectors, disposed within the contact openings, in direct contact with the source and drain regions and connected to the source and drain regions, wherein adhesion layers are disposed directly on the source and drain regions and are sandwiched between the contact openings and the metal connectors located within the contact openings, wherein the adhesion layers are made of a dielectric material and each of the adhesion layers is a closed wall structure that encloses and wraps around sidewalls of each of the metal connectors without being in contact with a bottom surface of each of the metal connectors.

9. The device of claim 8, wherein the metal connectors are electrically isolated from the gate stack structures through the spacers and the adhesion layers within the contact openings and the metal connectors are electrically connected to the source and drain regions.

10. The device of claim 8, wherein a material of the adhesion layers comprises silicon nitride, silicon oxynitride, silicon carbonitride (SiCN) or a combination thereof, while a material of the spacers comprises silicon nitride, silicon oxynitride or a combination thereof.

11. The device of claim 8, wherein a material of the metal connectors comprises tungsten, copper or alloys thereof.

12. The device of claim 8, wherein top surfaces of the metal connectors are substantially coplanar with a top surface of the dielectric layer.

13. The device of claim 8, wherein the source and drain regions are strained source and drain regions and a material of the source and drain regions comprises silicon germanium or silicon carbide.

14. A method for forming a fin-type field effect transistor, comprising:
providing a substrate with gate stack structures with sidewall spacers formed on the gate stack structures and source and drain regions formed in the substrate;
forming a dielectric layer over the substrate, covering the gate stack structures, the sidewall spacers and the source and drain regions;
patterning the dielectric layer to form a plurality of contact openings over the source and drain regions and exposing the source and drain regions;
forming a plurality of sheath structures on the source and drain regions and within the plurality of contact openings, covering sidewalls of the plurality of contact openings but exposing the source and drain regions, wherein the plurality of sheath structures is made of a dielectric material; and
forming a plurality of metal connectors within the plurality of sheath structures and on the source and drain regions, wherein the plurality of sheath structures is located between the plurality of metal connectors and the plurality of contact openings, and each of the plurality of sheath structures is a closed wall structure enclosing and wrapping around each of the plurality of metal connectors.

15. The method of claim 14, wherein forming the plurality of sheath structures within the plurality of contact openings comprises:
forming an adhesion layer over the substrate, conformally covering the plurality of contact openings and the patterned dielectric layer; and
removing the adhesion layer located on the patterned dielectric layer and on the source and drain regions.

16. The method of claim 15, wherein a material of the adhesion layer comprises silicon nitride, silicon oxynitride, SiCN or a combination thereof, and forming the adhesion layer comprises an atomic layer deposition (ALD) process or a plasma-enhanced ALD (PEALD) process.

17. The method of claim 15, wherein removing the adhesion layer located on the patterned dielectric layer and on the source and drain regions comprises performing at least one anisotropic etching process, one reactive ion etching (RIE) process, or a combination thereof.

18. The method of claim 14, wherein forming the plurality of metal connectors comprises forming tungsten within the plurality of contact openings by sputtering, chemical vapor deposition (CVD) or electrochemical plating (ECP).

19. The method of claim 14, wherein patterning the dielectric layer to form the plurality of contact openings comprises performing one or more anisotropic etching processes, reactive ion etching (RIE) processes, or a combination thereof.

20. The method of claim 14, further comprising forming a cap layer on the plurality of metal connectors and over the patterned dielectric layer.

* * * * *